(12) United States Patent
Chou

(10) Patent No.: US 7,554,421 B2
(45) Date of Patent: Jun. 30, 2009

(54) MICRO-ELECTROMECHANICAL SYSTEM (MEMS) TRAMPOLINE SWITCH/VARACTOR

(75) Inventor: Tsung-Kuan Allen Chou, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 374 days.

(21) Appl. No.: 11/435,259

(22) Filed: May 16, 2006

(65) Prior Publication Data

US 2007/0268095 A1 Nov. 22, 2007

(51) Int. Cl.
 *H01P 1/10* (2006.01)
 *H01H 57/00* (2006.01)
(52) U.S. Cl. .................. 333/105; 333/262; 200/181
(58) Field of Classification Search .............. 333/101, 333/262, 105, 200, 181; 200/181
 See application file for complete search history.

(56) References Cited

U.S. PATENT DOCUMENTS

| | | | |
|---|---|---|---|
| 5,258,591 A | 11/1993 | Buck | |
| 6,426,687 B1 * | 7/2002 | Osborn | 333/262 |
| 6,495,387 B2 | 12/2002 | French | |
| 6,657,525 B1 * | 12/2003 | Dickens et al. | 335/78 |
| 6,686,820 B1 | 2/2004 | Ma et al. | |
| 6,744,335 B2 * | 6/2004 | Ryhanen et al. | 333/185 |
| 6,812,810 B2 | 11/2004 | Ma et al. | |
| 6,812,814 B2 | 11/2004 | Ma et al. | |
| 6,875,936 B1 | 4/2005 | Suzuki et al. | |
| 6,876,482 B2 | 4/2005 | DeReus | |
| 6,880,235 B2 | 4/2005 | Ma | |
| 7,042,308 B2 | 5/2006 | Chou | |
| 7,170,155 B2 | 1/2007 | Heck et al. | |
| 7,171,235 B2 * | 1/2007 | Haapoja | 455/553.1 |
| 7,214,995 B2 | 5/2007 | Chou et al. | |
| 7,283,024 B2 | 10/2007 | Bar et al. | |
| 7,297,571 B2 * | 11/2007 | Ziaei et al. | 438/106 |
| 7,321,275 B2 | 1/2008 | Chou et al. | |
| 7,362,199 B2 | 4/2008 | Chou et al. | |

(Continued)

FOREIGN PATENT DOCUMENTS

GB 2 353 410 A 2/2001

(Continued)

OTHER PUBLICATIONS

Shen, Shyh-Chiang et al., "Low Actuation Voltage RF MEMS Switches With Signal Frequencies From 0.25GHz to 40GHz," IEDM Technical Digest, 1999, pp. 689-692.

(Continued)

*Primary Examiner*—Benny Lee
*Assistant Examiner*—Gerald Stevens
(74) *Attorney, Agent, or Firm*—Blakely, Sokoloff, Taylor & Zafman LLP

(57) ABSTRACT

A micro-electromechanical device includes an actuation electrode and a suspended electrode. The actuation electrode is disposed on a substrate. The suspended electrode is suspended proximate to the actuation electrode. The suspended electrode includes support members and a plate member. Each of the support members is clamped at either end to the substrate via anchors and the plate member is supported by the support members. The support members are flexible in response to an actuation voltage that is applied between the actuation electrode and the suspended electrode to allow the suspended electrode to electrostatically pull towards the actuation electrode. A signal line is coupled to the suspended electrode.

20 Claims, 8 Drawing Sheets

U.S. PATENT DOCUMENTS

| | | |
|---|---|---|
| 2002/0190267 A1 | 12/2002 | Robertson |
| 2003/0020173 A1 | 1/2003 | Huff et al. |
| 2003/0058069 A1 | 3/2003 | Schwartz et al. |
| 2003/0201852 A1 | 10/2003 | Eliacin et al. |
| 2004/0000696 A1 | 1/2004 | Ma et al. |
| 2004/0050675 A1* | 3/2004 | Feng et al. .................. 200/181 |
| 2004/0183148 A1 | 9/2004 | Blasko, III |
| 2005/0007219 A1 | 1/2005 | Ma et al. |
| 2005/0134413 A1 | 6/2005 | Bar et al. |
| 2005/0219016 A1 | 10/2005 | Chou et al. |
| 2005/0236260 A1* | 10/2005 | Pasch et al. .................. 200/181 |
| 2005/0248424 A1 | 11/2005 | Chou et al. |
| 2005/0285697 A1 | 12/2005 | Chou et al. |
| 2006/0065942 A1 | 3/2006 | Chou et al. |
| 2006/0226501 A1 | 10/2006 | Chou |
| 2006/0289954 A1 | 12/2006 | Bar-Sadeh et al. |
| 2007/0268095 A1 | 11/2007 | Chou |

FOREIGN PATENT DOCUMENTS

| | | |
|---|---|---|
| WO | WO 97/18574 | 5/1997 |
| WO | WO 99/17322 | 4/1999 |
| WO | WO 2005/023699 A1 | 3/2005 |
| WO | WO 2005/104158 A1 | 11/2005 |

OTHER PUBLICATIONS

Pacheco, Sergio P. et al., "Design of Low Actuation Voltage RF MEMS Switch," IEEE MTT-S Digest, 2000, pp. 165-168.

Park, Jae et al., "Electroplated RF MEMS Capacitive Switches," The Thirteenth Annual International Conference on MEMS 2000, Jan. 23-27, 2000, pp. 639-644.

U.S. Appl. No. 11/092,022, filed May 13, 2005.

U.S. Appl. No. 11/165,795, filed Jun. 23, 2005.

U.S. Appl. No. 11/168,195, filed Jul. 1, 2005.

U.S. Appl. No. 11/317,960, filed Dec. 22, 2005.

Nishijima, N. et al., "A Low-Voltage High Contact Force RF-MEMS Switch," *IEEE MTT-S Digest* (2004), pp. 577-580.

International Search Report for PCT/US2006/046894 (filed Dec. 7, 2006), mailed May 14, 2007 (3 pages).

Written Opinion of the International Search Authority for PCT/US2006/046894 (filed Dec. 7, 2006), mailed May 14, 2007 (5 pages).

International Search Report for PCT/US2006/024724 (WO2007/002549), filed Jun. 23, 2006, Report mailed Nov. 2, 2006 (5 pages).

Written Opinion of the International Search Authority for PCT/US2006/024724 (WO2007/002549), filed Jun. 23, 2006, Opinion mailed Dec. 23, 2007 (8 pages).

* cited by examiner

MICRO-ELECTROMECHANICAL SYSTEM (MEMS) TRAMPOLINE SWITCH/VARACTOR

TECHNICAL FIELD

This disclosure relates generally to micro-electromechanical systems ("MEMS"), and in particular, relates to MEMS switches and/or varactors.

BACKGROUND INFORMATION

Micro-electromechanical systems ("MEMS") devices have a wide variety of applications and are prevalent in commercial products. One type of MEMS device is a MEMS radio frequency (RF) switch. A typical MEMS RF switch includes one or more MEMS switches arranged in an RF switch array. MEMS RF switches are ideal for wireless devices because of their low power characteristics and ability to operate in radio frequency ranges. MEMS RF switches are well suited for applications including cellular telephones, wireless networks, communication systems, and radar systems. In wireless devices, MEMS RF switches can be used as antenna switches, mode switches, transmit/receive switches, and the like.

Known MEMS switches use an electroplated metal cantilever supported at one end and having an electrical RF contact near the distal end of the metal cantilever. An actuation electrode is positioned below the electrical RF contact and a direct current ("DC") actuation voltage applied to either the actuation electrode or the metal cantilever forces the metal cantilever to bend downward and make electrical contact with a bottom RF signal trace. Once electrical contact is established, the circuit is closed and an RF signal superimposed over the DC actuation voltage can pass through the metal cantilever to the actuation electrode and/or to the bottom RF signal trace.

Cantilever based MEMS switches suffer from "stiction" (i.e., stuck in a closed circuit position) and tend to be self-actuated by RF signals or vibrations due to their low spring constants. During fabrication, the electroplated metal cantilever suffers from high stress gradients and therefore has a tendency to curl upwards at the distal end, referred to as switch stress gradient bending. Accordingly, the actuation voltage must be sufficiently large to overcome the larger separation distance due to beam bending and induce electrostatically collapsing contact between the metal cantilever and the actuation electrode below. Furthermore, during high speed switching operation, known MEMS switches suffer from frequency limiting, air damping resistance.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a micro-electromechanical system ("MEMS") trampoline switch/varactor and systems thereof are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
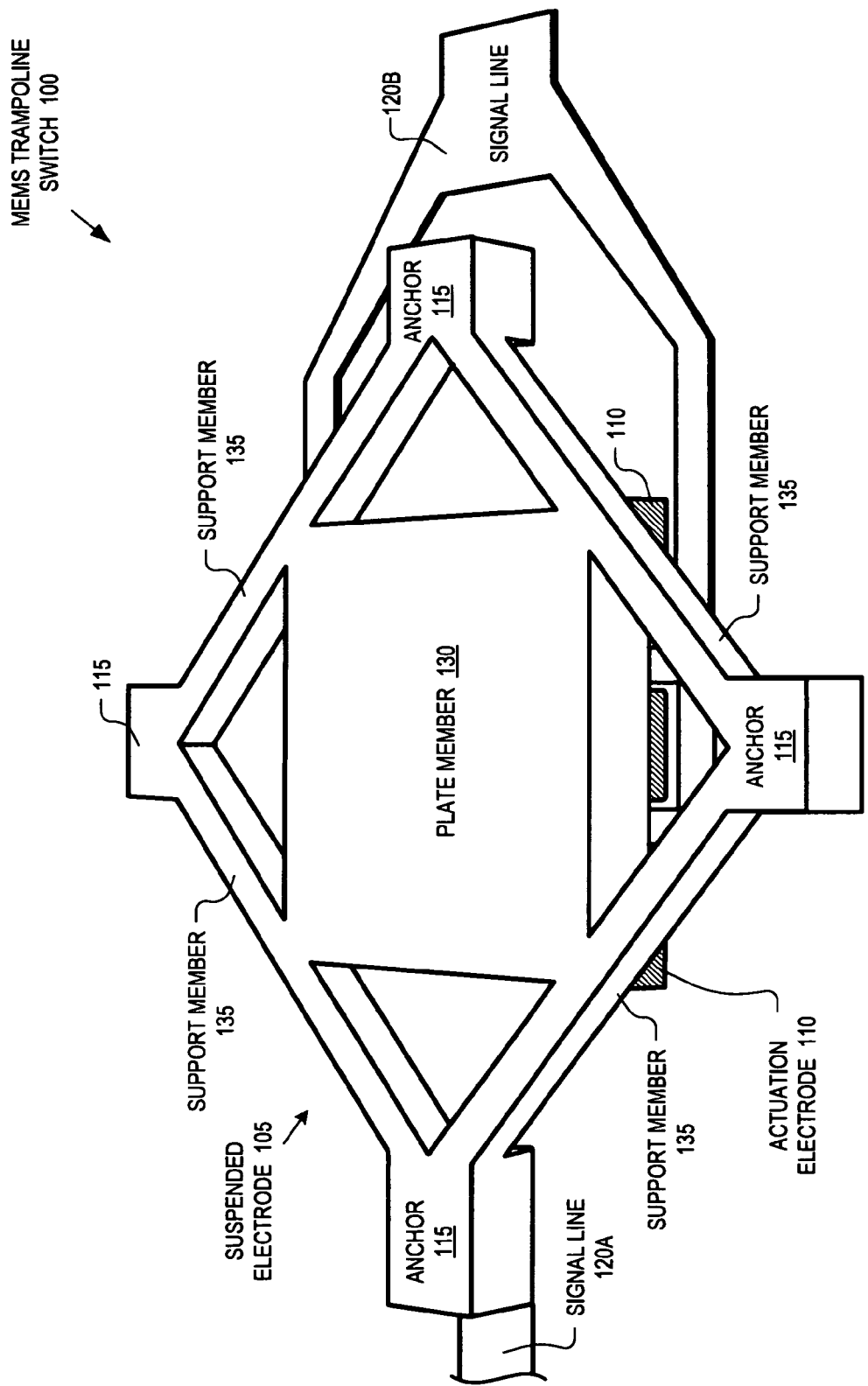
FIG. 1 is a perspective view illustrating a micro-electromechanical system ("MEMS") trampoline switch, in accordance with an embodiment of the invention.
Figure 2A:
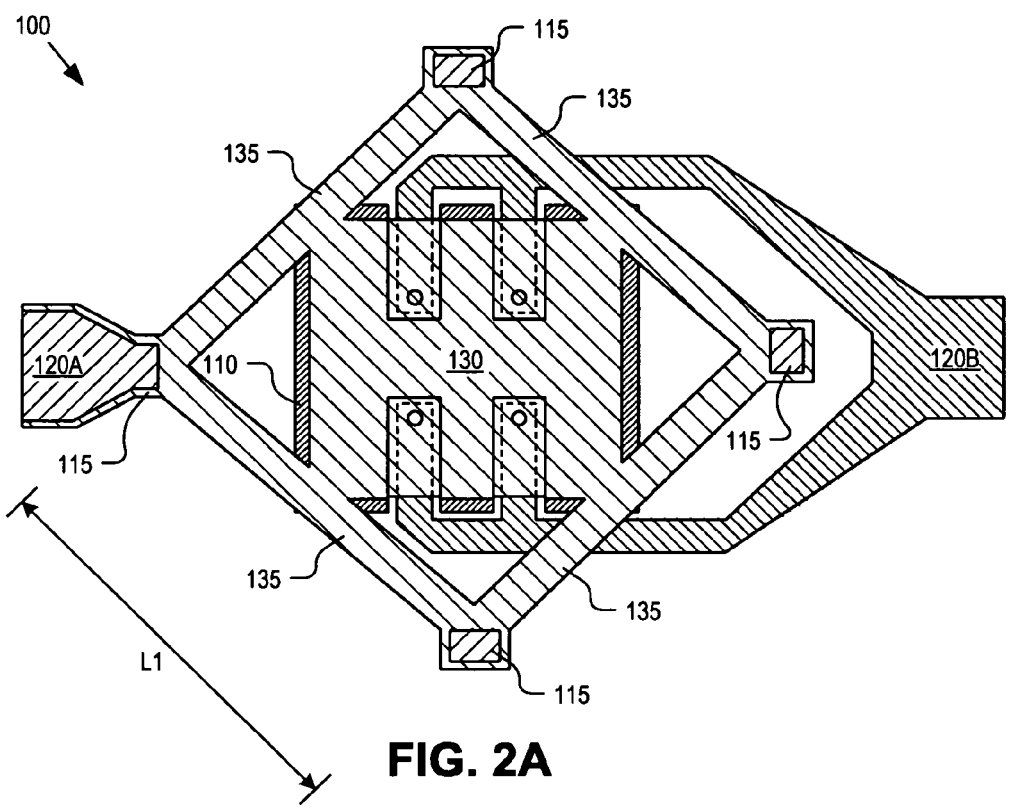
FIG. 2A is a schematic diagram illustrating a plan view of a MEMS trampoline switch, in accordance with an embodiment of the invention.
Figure 2B:
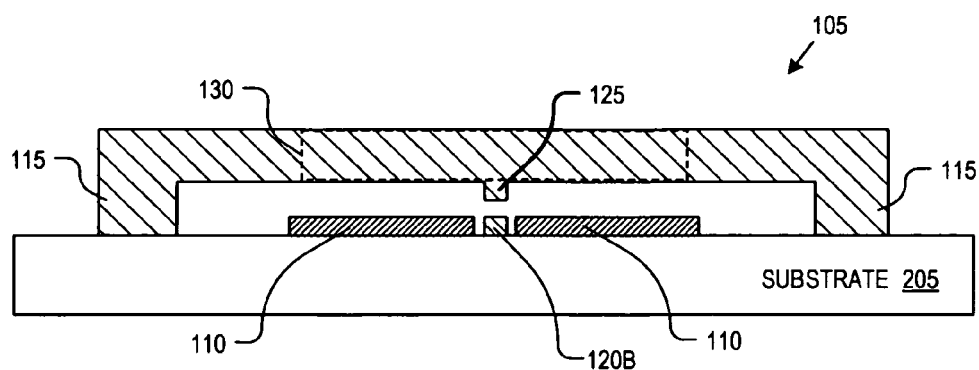
FIG. 2B is a schematic diagram illustrating a cross-sectional view of a MEMS trampoline switch, in accordance with an embodiment of the invention.

FIGS. 1, 2A, and 2B are diagrams illustrating a MEMS trampoline switch 100, in accordance with an embodiment of the invention. FIG. 1 is a perspective view of MEMS trampoline switch 100 while FIG. 2A is a plan view and FIG. 2B is a cross-sectional view of the same. It should be appreciated that the figures herein are not drawn to scale, but rather are merely intended for illustration. Furthermore, FIG. 2B illustrates a slight modification to MEMS trampoline switch 100 from what is illustrated in FIGS. 1 and 2A, as is discussed below.

The illustrated embodiment of MEMS trampoline switch 100 includes a suspended electrode 105, an actuation electrode 110, anchors 115, signal lines 120A and 120B, a contact 125, and a substrate 205. The illustrated embodiment of suspended electrode 105 includes a plate member 130 and support members 135 (also referred to as clamped beams). Although not illustrated, actuation electrode 110 includes an input port for applying an actuation voltage between actuation electrode 110 and suspended electrode 105 to induce an electrostatic collapse of suspended electrode 105 towards actuation electrode 110. It should be appreciated that in some cases only one or two instances of a component/element have been labeled so as not to crowd the drawings.

With reference to FIGS. 1, 2A, and 2B the components of MEMS trampoline switch 100 and their interrelation are discussed below. Substrate 205 may be formed using any material including various semiconductor substrates (e.g., silicon substrate). Although not illustrated, substrate may comprise multiple layers including a bulk layer and an insulating layer. Actuation electrode 110 may be formed over the insulator layer to insulate actuation electrode 110 from the bulk layer and other components/traces disposed in the bulk layer. The bulk layer may include a number of sub-layers having signal traces or components (e.g., transistors and the like) integrated therein and electrically coupled to any of signal line 120A, 120B, and/or the input port of actuation electrode 110. In an embodiment where the bulk layer includes silicon, the insulator layer may include a layer of silicon nitride or silicon oxide approximately 0.25 µm thick.

In one embodiment, signal lines 120A and 120B are formed over substrate 205 to propagate radio frequency ("RF") signals. However, it should be appreciated that embodiments of MEMS trampoline switch 100 may be used to switch other frequency signals including direct current ("DC") signals, low frequency signals, microwave signals, and the like. Signal lines 120A and 120B may be formed using any conductive material, including metal, such as gold (Au). In one embodiment, signal lines 120A and 120B are 0.3-5 µm thick with their width determined to achieve a desired impedance value.

As mentioned above, suspended electrode 105 includes plate member 130 and support members 135. Suspended electrode 105 may be formed of any conductive material or metal (e.g., gold Au). In one embodiment, suspended electrode 105 is approximately 5 µm to 10 µm thick. Support members 135 are clamped at each of their ends by anchors 115 and suspended above substrate 205 (e.g., ≈0.7 µm to 1.0 µm). Plate member 130 is suspended by support members 135. Support members 135 surround plate member 130 and coupled to plate member 130 at multiple contact points around a perimeter of plate member 130. In the illustrated embodiment, plate member 130 is a substantially flat rectangular plate coupled at its corners to midpoints of four support members 135. It should be appreciated that plate member 130 could assume other shapes (e.g., circle, oval, triangle, pentagon, hexagon, polygon, etc.) and more or less support members 135 may be used. In one embodiment, suspended electrode has a length L1 (e.g., ≈75-150 µm) and support members 135 have cross-sectional dimensions ≈5-10 µm thick and ≈8-16 µm wide. It should be appreciated that other dimensions may be implemented. In one embodiment, anchors 115 have cross-sectional dimensions of approximately 10-50 µm.

Actuation electrode 110 is disposed over substrate 205 to form a bottom electrode for actuating suspended electrode 105 and turning on/off MEMS trampoline switch 100. Actuation electrode 110 may be formed of any number of conductive materials, including polysilicon or metal. In one embodiment, actuation electrode 110 has a thickness of approximately 0.1-0.4 µm. In one embodiment, suspended electrode 105 is suspended approximately 0.6 µm above actuation electrode 110, when suspended electrode 105 is in a relaxed and unactuated position. Other separation distances may be used, as well.

Contact 125 protrudes from the underside of plate member 130 facing actuation electrode 110. Contact 125 extends below suspended electrode 105 to make electrical contact with signal line 120B when MEMS trampoline switch 100 is closed circuited. In one embodiment, contact 125 is fabricated of metal, such as gold (Au). In the embodiment illustrated in FIG. 2A, plate member 130 includes four contacts 125 for connecting to four branches of signal line 120B. In the embodiment illustrated in FIG. 2B, only one such contact is illustrated. Any number of contacts 125 may be implemented. However, in clean environments multiple contacts 125 may be desirable to increase the electrical connection surface area made with signal line 120B to decrease ohmic resistance and insertion loss, while in dirty environments fewer contacts 125 or even only one, may be desirable to increase the compressive force/pressure generate at contact 125. Higher compressive pressure not only reduces RF insertion loss, but in environments where debris or contaminates may accumulate over time helps clear or crush the debris to retain good electrical contact when MEMS trampoline switch 100 is closed circuited.

Suspended electrode 105 may be fabricated by first defining actuation electrode 110 and anchors 115 on substrate 205, then forming a sacrificial layer (e.g., deposited oxide) over actuation electrode 110 to fill the air gap between suspended electrode 105 and actuation electrode 110. Next, suspended electrode 105 may be formed and defined over the sacrificial layer and anchors 115. Subsequently, the sacrificial layer may be etched away with an acid bath (e.g., hydrofluoric acid) to free the suspended electrode 105.

It should be appreciated that a number of modifications may be made to the structure of MEMS trampoline switch 100 illustrated in FIGS. 1, 2A, and 2B within the spirit of the present invention. The specific shapes of suspended electrode 105 (including plate member 130 and support members 135), actuation electrode 110, and signal lines 120, as well as other components, may be altered.

Figure 3A:
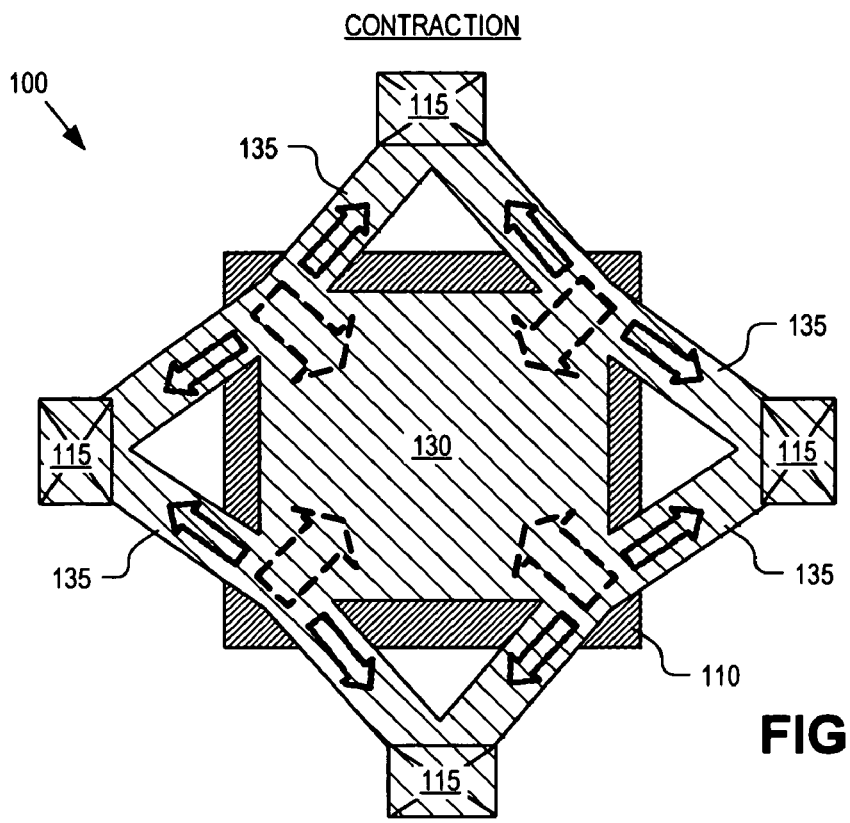
FIG. 3A is a diagram illustrating thermal or residual contraction of a MEMS trampoline switch, in accordance with an embodiment of the invention.
Figure 3B:
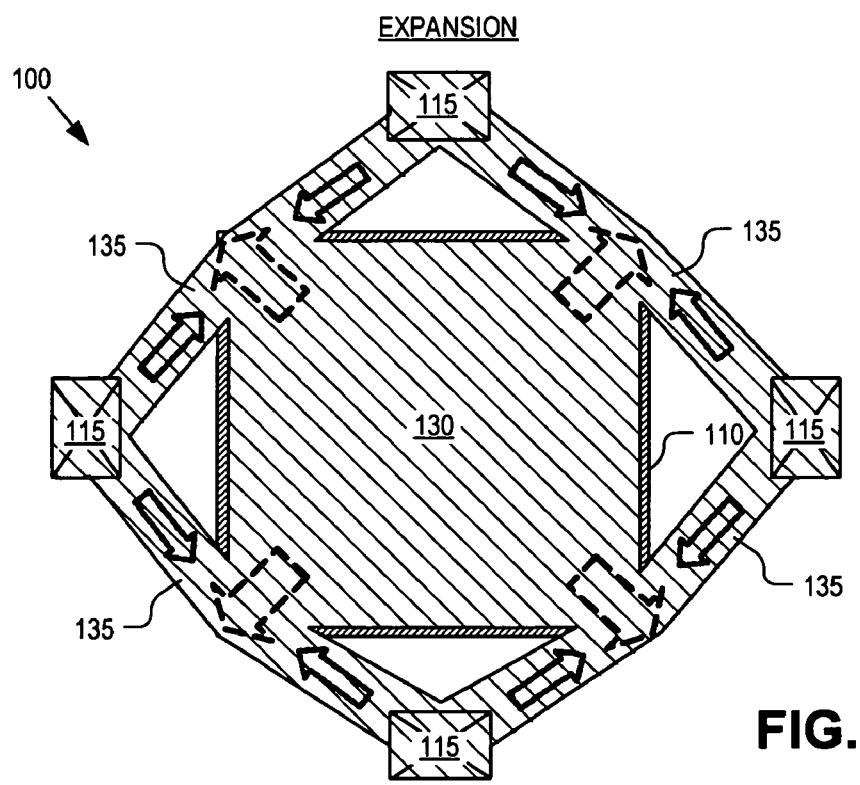
FIG. 3B is a diagram illustrating thermal or residual expansion of a MEMS trampoline switch, in accordance with an embodiment of the invention.

FIGS. 3A and 3B are diagrams illustrating thermal or residual contraction and expansion of MEMS trampoline switch 100, in accordance with an embodiment of the invention. During fabrication of suspended electrode 105, residual stress may be bound into the components of suspended electrode 105. These residual stresses often assert themselves upon etching away the sacrificial layer described above to free suspended electrode 105.

Residual stresses may include stress gradients from electroplating or other tensile/compressive forces. In the case of cantilever MEMS switches, where one end of the cantilever electrode is clamped and the distal end is free, stress gradients tend to detrimentally curl the distal end upwards away from the actuation electrode. However, since both ends of support members 135 are clamped to anchors 115, support members 135 do not suffer from the detrimental effects of stress gradients. Similarly, since all corners of plate member 130 are coupled to support members 135, plate member 130 also does not suffer from curling due to stress gradients.

While double clamp structures are resistant to curling from stress gradients, conventional double clamp structures tend to warp from residual or thermal stresses. The inherent structure of MEMS trampoline switch 100 ameliorates warping by providing flex zones in the compliant support members 135. As illustrated in FIG. 3A, if plate member 130 contracts due to a temperature change or a residual stress, support members 135 will flex laterally inward to accommodate the contraction. Although suspended electrode 105 is flexing in the lateral plane, plate member 130 remains relatively undisturbed in the vertical axis, maintaining a relatively fixed height from and level surface over actuation electrode 110.

Similarly, as illustrated in FIG. 3B, if plate member 130 expands due to a temperature change or a residual stress, support members 135 will flex laterally outward to accommodate the expansion. Although suspended electrode 105 is flexing in the lateral plane, plate member 130 remains relatively undisturbed in the vertical axis, maintaining a relatively fixed height from and level surface over actuation electrode 110.

Figure 4:
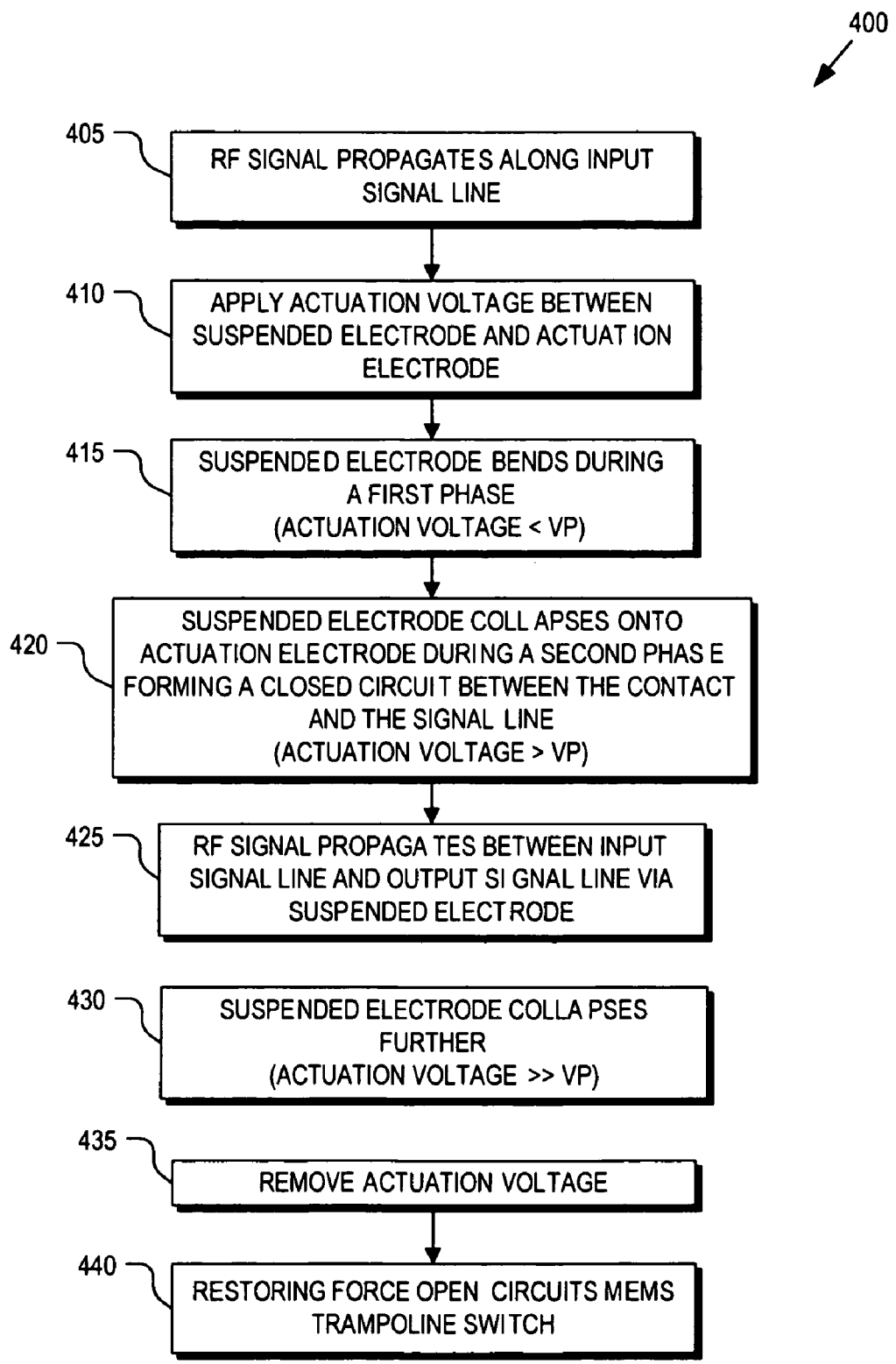
FIG. 4 is a flow chart illustrating a process of operation of a MEMS trampoline switch, in accordance with an embodiment of the invention.

FIG. 4 is a flow chart illustrating a process 400 for operation of MEMS trampoline switch 100, in accordance with an embodiment of the invention. It should be appreciated that the order in which some or all of the process blocks appear in process 400 should not be deemed limiting. Rather, one of ordinary skill in the art having the benefit of the present disclosure will understand that some of the process blocks may be executed in a variety of orders not illustrated.

In a process block 405, an RF signal is propagated along signal line 120A. In a process block 410, an actuation voltage is applied between actuation electrode 110 and suspended electrode 105. In one embodiment, suspended electrode 105 is electrically direct current ("DC") grounded through anchors 115 and/or RF signal line 120A, and the actuation voltage is applied to actuation electrode 110 through an input port. The RF signal may be superimposed over a direct current ("DC") bias voltage. Alternatively, actuation electrode 110 may be grounded through the input port and the actuation voltage applied to suspended electrode 105 through anchors 115 and/or signal line 120A.

Figure 5A:
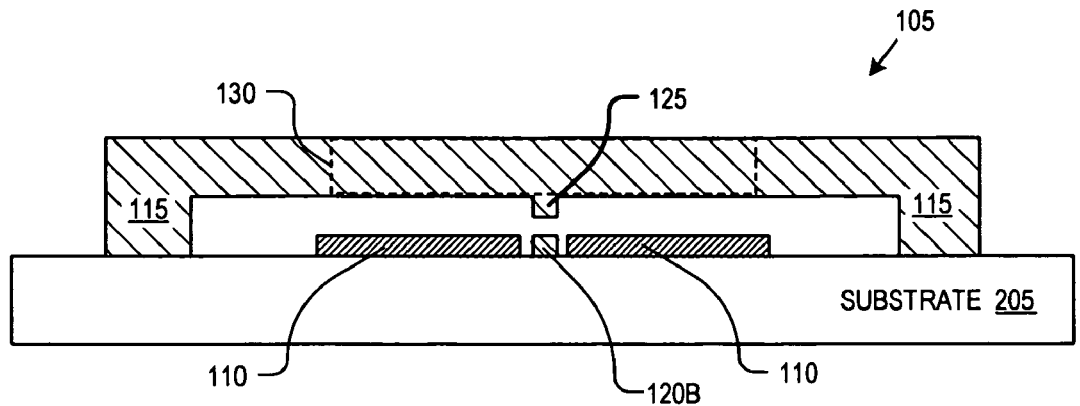
FIG. 5A is a schematic diagram illustrating a first bending phase of a MEMS trampoline switch in an open circuit position, in accordance with an embodiment of the invention.

FIG. 5A illustrates suspended electrode 105 in the unactuated or relaxed position. In a process block 415, application of the actuation voltage across suspended electrode 105 and actuation electrode 110 induces suspended electrode 105 to bend or electrostatically pull towards actuation electrode 110. During this initial bending phase, the actuation voltage has a magnitude that is less than the pull-in voltage Vp required to completely collapse plate member 130 onto actuation electrode 110. It is during this initial bending phase that suspended electrode 105 may operate as a multi-state varactor with analog capacitance control (discussed in greater detail in connection with FIGS. 7A and 7B).

Figure 5B:
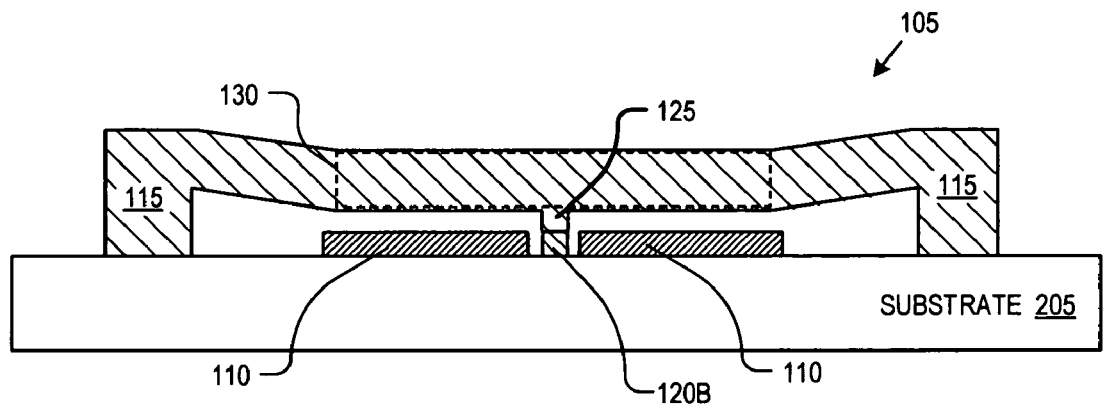
FIG. 5B is a schematic diagram illustrating a second bending phase of a MEMS trampoline switch in a closed circuit position, in accordance with an embodiment of the invention.

In a process block 420, the actuation voltage is increased passed Vp, as illustrated in FIG. 5B. During this second bending phase, the actuation voltage is sufficient to cause the compliant support members 135 to flex causing plate member 130 to collapse to a point where contact 125 makes physical and electrical contact with signal line 120B. At this point, MEMS trampoline switch 100 is closed circuited. In a process block 425, once MEMS trampoline switch 100 is closed circuited, the RF signal propagates from input signal line 120A to output signal line 120B through suspended electrode 105 and contact 125.

In an embodiment where support members are approximately 75 µm to 150 µm and the separation distance between suspended electrode 105 and actuation electrode 110 is approximately 0.3 µm to 0.6 µm, the actuation voltage may range between 30V to 40V. However, other actuation voltages may be achieved by vary design factors such as length L1 of support members 135, varying the separation distance between suspended electrode 105 and actuation electrode 110, varying the cross-sectional dimensions of support members 130, and the like. For example, by increasing length L1 of support members 135 to greater than 300 µm, actuation voltages of approximately 10V may be achieved.

Figure 5C:
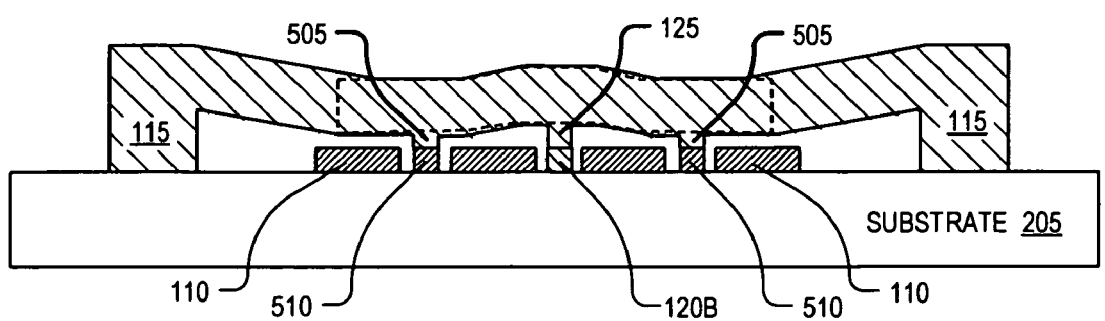
FIG. 5C is a schematic diagram illustrating a third bending phase of a MEMS trampoline switch in a closed circuit position, in accordance with an embodiment of the invention.

In a process block 430, if the actuation voltage substantially exceeds the pull-in voltage Vp, then plate member 130 may flex as illustrated in FIG. 5C. Actuation voltages that substantially exceed Vp may be used to achieve higher switching frequencies. If actuation voltages exceeding Vp are used, then it may be desirable to use either multiple contacts 125 distributed around the bottom surface of plate member 130 (see FIG. 2A) or multiple protruding stoppers 505 disposed on the underside of plate member 130 to prevent suspended electrode 105 from electrically shorting with actuation electrode 110.

If suspended electrode 105 were to form electrical connection with actuation electrode 110 while MEMS trampoline switch 100 is closed circuited, then the actuation voltage between the two electrodes would be shorted, and MEMS trampoline switch 100 would open. Further, allowing actuation electrode 110 and suspended electrode 105 to short circuit results in needless and harmful power dissipation. Accordingly, in one embodiment, multiple stoppers 505 are positioned on underside of plate member 130 to align with the insulated stopper butts 510 so as to prevent an electrical connection between suspended electrode 105 and actuation electrode 110. In the illustrated embodiment, stopper butts 510 are electrically insulated from actuation electrode 110 by an air gap (e.g., ≈2-3 µm). Stoppers 505 mate with stopper butts 510 and prevent suspended electrode 105 from collapsing directly onto actuation electrode 110 and forming an electrical connection thereto. In one embodiment, stoppers 505 are slightly shorter than contact 125 to allow contact 125 to apply maximum contact pressure against signal line 120B.

Once the actuation voltage is disabled or removed (process block 435), the restoring force created within the flexed supported members 135 separates contact 125 from signal line 120B, thereby open circuiting MEMS trampoline switch 100. The structure of suspended electrode 105, which uses dual clamped support members 135, is an inherently stiffer structure than a cantilever design with only one side clamped. This stiffer structure can provide greater restoring forces to avoid "stiction" (suck in the closed circuit position). Furthermore, a stiffer design with higher restoring forces may enable MEMS trampoline switch 100 to operate a higher switching frequencies.

It should be appreciated that MEMS trampoline switch 100 maximizes the electrostatic force for the same actuation voltage as compared to a MEMS cantilever switch design. MEMs trampoline switch 100 does not suffer from stress gradients, residual stresses, or thermal stresses to the same extend observed in either cantilever beam structures or conventional double clamp beam structures. Higher contact force can be achieved to obtain better switch contact (lower contact resistance) for signal transmission. MEMS trampoline switch 100 also enables higher RF signal power handling. The higher electrostatic force generated by MEMS trampoline switch 100 is suitable for use with stiffer beam springs, which increase the switch opening force significantly. Furthermore, MEMS trampoline switch 100 achieves better reliability due to less risk of contact stiction.

Figure 6A:
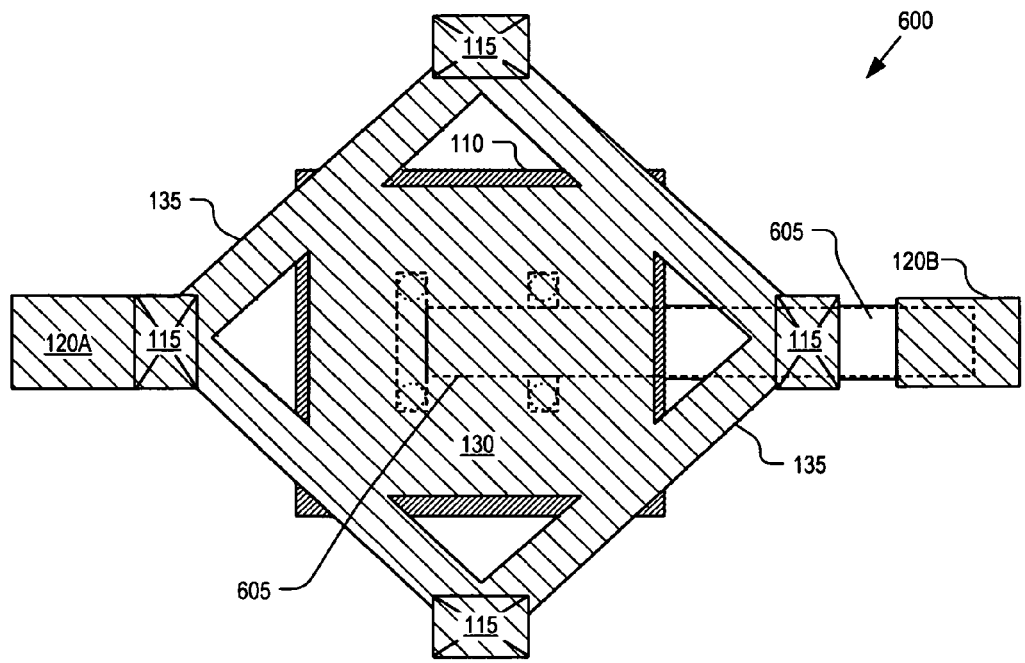
FIG. 6A is a schematic diagram illustrating a plan view of a MEMS trampoline switch with a buried RF trace, in accordance with an embodiment of the invention.
Figure 6B:
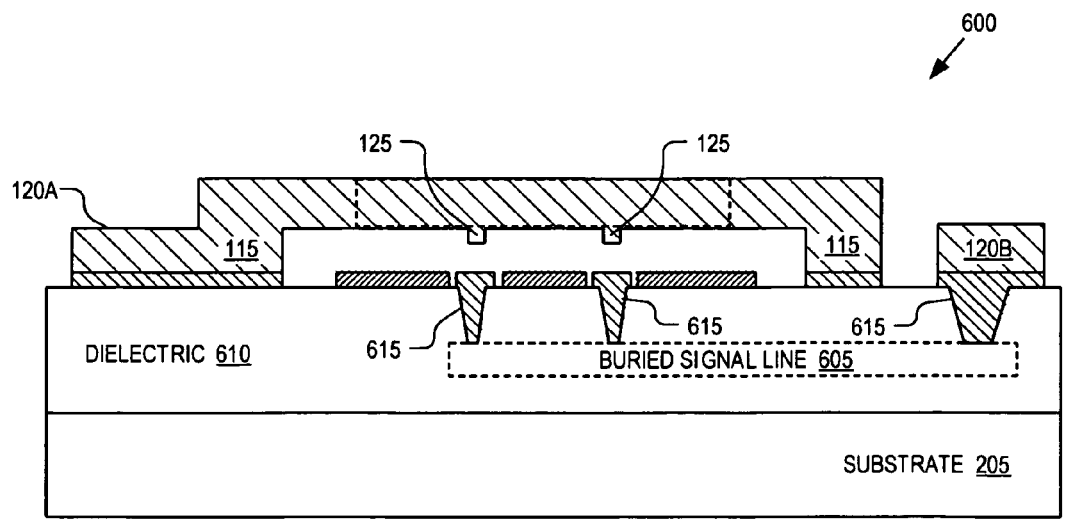
FIG. 6B is a schematic diagram illustrating a cross-sectional view of a MEMS trampoline switch with a buried RF trace, in accordance with an embodiment of the invention.

FIGS. 6A and 6B illustrating a MEMS trampoline switch 600 with a buried signal line, in accordance with an embodiment of the invention. FIG. 6A is a plan view of MEMS trampoline switch 600, while FIG. 6B is a cross-sectional view of the same.

MEMS trampoline switch 600 is similar to MEMS trampoline switch 100, with the exception of a buried signal line 605. As illustrated, buried signal line 605 is buried below actuation electrode 110 to increase the separation distance between suspended electrode 105 and buried signal line 605. Increasing the separation distance reduces parasitic capacitances. Furthermore, in the illustrated embodiment, buried signal line 605 is disposed within a low dielectric material layer 610 (e.g., oxide). Using a low dielectric material also reduces parasitic capacitances. Conductive vias 615 are disposed within dielectric layer 610 to couple buried signal line 605 to signal line 120B and provide a point of contact to contacts 125. Buried signal line 605 may be formed of highly conductive material including metal (e.g., Aluminum Al, gold Au, etc.), alloys, or the like.

Figure 7A:
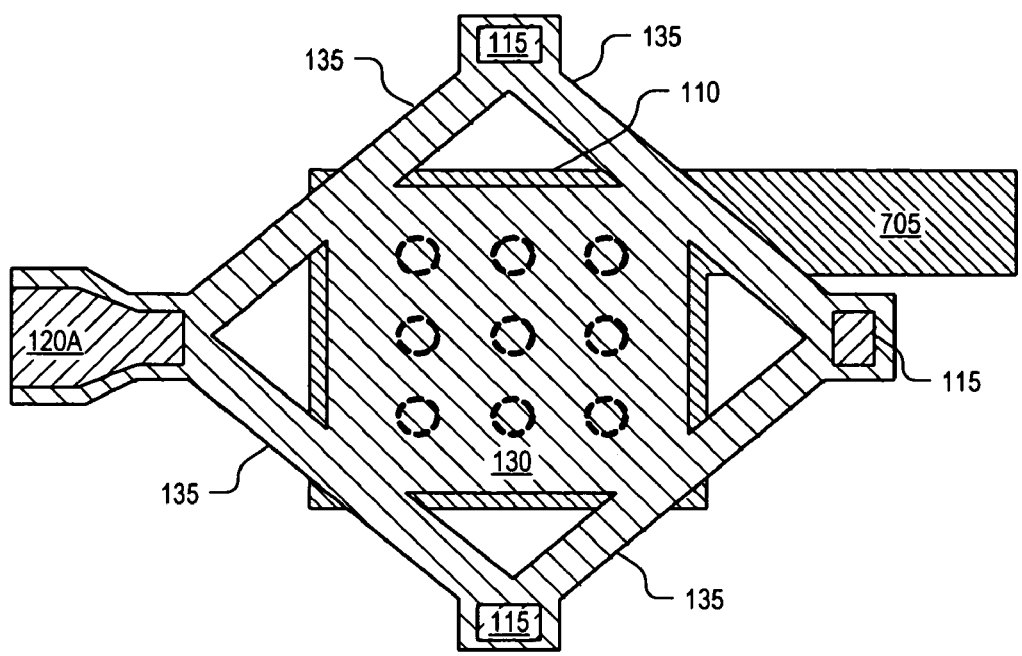
FIG. 7A is a schematic diagram illustrating a plan view of a MEMS trampoline varactor, in accordance with an embodiment of the invention.
Figure 7B:
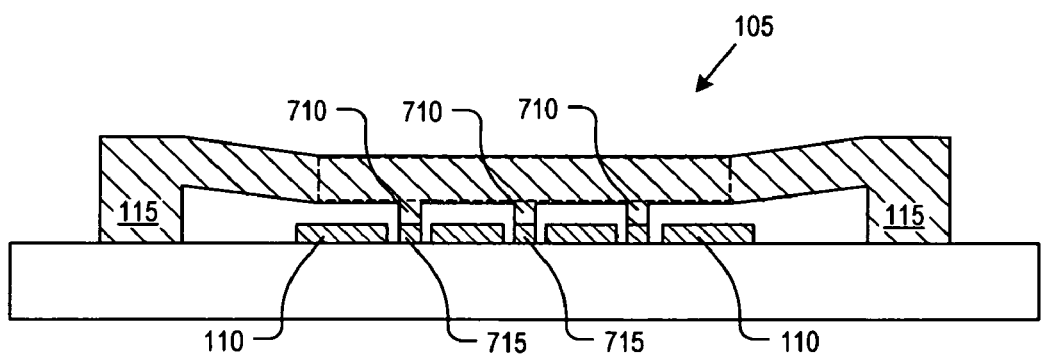
FIG. 7B is a schematic diagram illustrating a cross-sectional view of a MEMS trampoline varactor, in accordance with an embodiment of the invention.

FIGS. 7A and 7B are schematic diagrams illustrating a MEMS trampoline varactor 700, in accordance with an embodiment of the invention. FIG. 7A is a plan view of MEMS trampoline varactor 700, while FIG. 7B is a cross-sectional view of the same. MEMS trampoline varactor 700 is similar to MEMS trampoline switch 100, with the differences discussed below.

MEMS trampoline varactor 700 includes an input port 705 for biasing actuation electrode 110, while suspended electrode 105 may be biased by signal line 120A or by bias lines coupled to any of anchors 115 (not illustrated). In one embodiment of MEMS trampoline varactor 700, actuation electrode 110 may be formed of a conductive metal (e.g., gold Au). MEMS trampoline varactor 700 operates in a similar manner as discussed in connection with process 400. By applying an actuation voltages across suspended electrode 105 and actuation electrode 110, the separation distance between the two electrodes can be varied, thereby varying the capacitance of MEMS trampoline varactor 700. RF signals may then be superimposed over the DC bias voltages and filtered due to the selectable inherent capacitance of the two electrodes.

The illustrated embodiment of MEMS trampoline varactor 700 includes a plurality of protruding stoppers 705 disposed on the underside of plate member 130. Protruding stoppers 705 are positioned to physically abut insulated butt stoppers 715 when suspended electrode 105 electrostatically collapses towards actuation electrode 110. Protruding stoppers 705 and butt stoppers 715 prevent plate member 135 from electrically shorting with actuation electrode 110.

In one embodiment, MEMS trampoline varactor 700 operates as a two-state filter having two capacitance values: an "off" capacitance value associated with the unactuated or relaxed separation distance and an "on" capacitance value associated with the fully actuated separation distance (actuation voltage>Vp).

In one embodiment, MEMS trampoline varactor 700 may be operated as a multi-state filter capable of achieving a plurality of capacitance values. By limiting the actuation voltage to values less than the pull-in voltage Vp, suspended electrode 105 can be made to flex toward actuation electrode 110 with varying degrees without causing an electrostatic collapse. Actuation voltages less than Vp can achieve a flexing mobility range for suspended electrode 105 equal to about one third of the relaxed or full separation distance between suspended electrode 105 and actuation electrode 110. Thus, discrete actuation voltages or continuous analog actuation voltages less than Vp may be applied between the two electrodes to achieve a plurality of programmable capacitance values for MEMS trampoline varactor 700.

Figure 8:
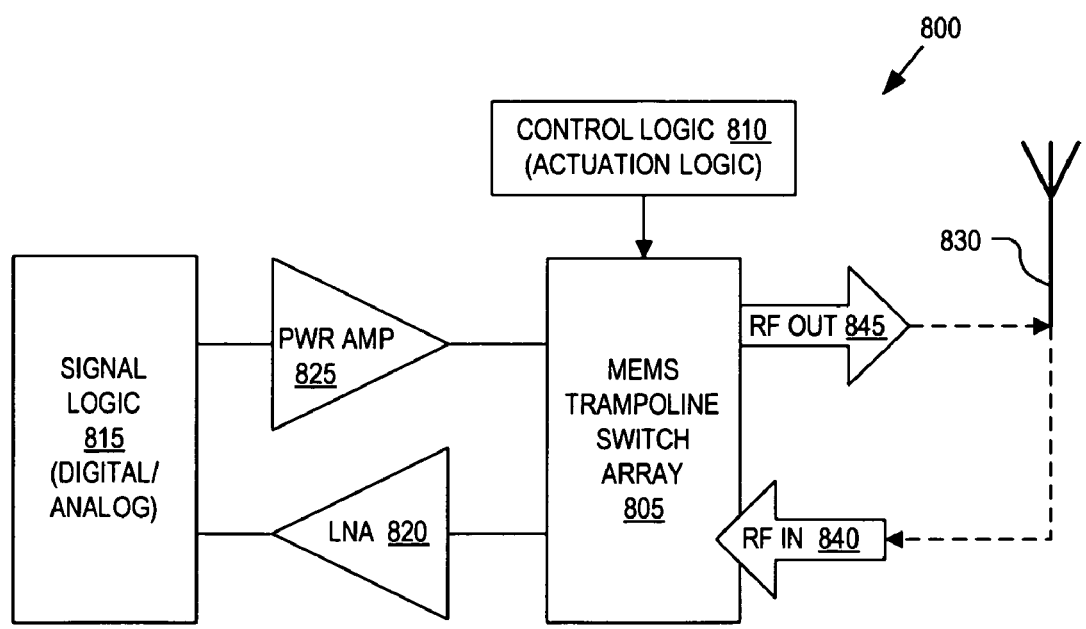
FIG. 8 is a functional block diagram illustrating a demonstrative device implemented with a MEMS trampoline switch/varactor array, in accordance with an embodiment of the invention.

FIG. 8 is a functional block diagram illustrating a demonstrative device 800 implemented with a MEMS array, in accordance with an embodiment of the invention. Device 800 may represent any wireless, RF, or microwave device including a wireless access point, a wireless computing device, a cell phone, a pager, a two-way radio, a radar system, and the like.

The illustrated embodiment of device 800 includes a MEMS array 805, control logic 810, signal logic 815, a low noise amplifier ("LNA") 820, a power amplifier 825, and an antenna 830. MEMS array 805 may include one or more MEMS trampoline switches 100, MEMS trampoline switches 600, or MEMS trampoline varactors 700. All or some of the components of device 800 may or may not be integrated into a single semiconductor substrate (e.g., silicon substrate).

Control logic 810 may also be referred to as the actuation logic and is responsible for applying the actuation voltage for switching on/off the MEMS switches/varactors within MEMS array 805. Control logic 810 couples to actuation electrode 10 and/or suspended electrode 105 of each MEMS trampoline switch/varactor within MEMS array 805.

During a receive operation, control logic 810 applies the actuation voltage to those MEMS trampoline switches/varactors coupled to RF input 840 such that an RF signal propagates through MEMS array 805 to LNA 820 from antenna 830. LNA 820 amplifies the RF signal and provides it to signal logic 815. Signal logic 815 may include analog-to-digital converters to convert the RF signal to a digital signal and further include logic elements to process the digital signal. During a transmit operation, control logic 810 applies the actuation voltage to those MEMS trampoline switches/varactors coupled to RF output 845 such that an RF signal propagates through MEMS array 805 to antenna 830 from power amplifier 825. Signal logic 815 may further include logic to generate a digital signal and a digital-to-analog converter to modulate the digital signal onto an RF carrier frequency. In one embodiment, antenna 830 is a dipole antenna, an omni-directional antenna, or otherwise. MEMS trampoline varactors may be coupled to other circuit components (e.g., inductors and resistors) to create tunable filters for filtering the input and output RF signals.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A system comprising:
an amplifier;
a dipole antenna; and
a micro-electromechanical system ("MEMS") switch coupled in series with the amplifier and the antenna, the MEMs switch including:
an actuation electrode disposed on a substrate;
a suspended electrode suspended proximate to the actuation electrode, the suspended electrode including at least three support members and a plate member, each of the at least three support members are clamped at both ends to the substrate via anchors, the plate member supported by the at least three support members;

a first signal line coupled to the suspended electrode; and a second signal line positioned proximate to the suspended electrode to form a closed circuit with the suspended electrode and the first signal line when an actuation voltage is applied between the actuation electrode and the suspended electrode that causes the suspended electrode to electrostatically pull towards the actuation electrode.

2. The system of claim 1, wherein the support members surround the plate member and couple to the plate member at multiple contact points around a perimeter of the plate member.

3. The system of claim 2, wherein the MEMS switch further includes:

a second signal line positioned proximate to the suspended electrode to form a closed circuit with the suspended electrode and the first signal line when the actuation voltage is applied between the actuation electrode and the suspended electrode that causes the suspended electrode to electrostatically collapse towards the actuation electrode; and at least one contact disposed on the suspended electrode and protruding from a surface of the suspended electrode facing the actuation electrode, the contact positioned to make electrical contact with the second signal line when the actuation voltage is applied.

4. The system of claim 3, wherein the second signal line comprises a buried signal trace running under the suspended electrode, the MEMS switch further comprising:

a dielectric material layer disposed between the actuation electrode and the buried signal trace; and at least one electrical via disposed in the dielectric material layer, the at least one electrical via coupled to the buried signal trace and aligned to make an electrical connection with the at least one contact disposed on the suspended electrode when the actuation voltage is applied.

5. An apparatus, comprising:

an actuation electrode disposed on a substrate;

a suspended electrode suspended proximate to the actuation electrode, the suspended electrode including at least three support members and a plate member, each of the at least three support members clamped at both ends to the substrate via anchors and the plate member supported by the at least three support members, wherein the at least three support members flex in response to an actuation voltage that is applied between the actuation electrode and the suspended electrode to allow the suspended electrode to electrostatically pull towards the actuation electrode; and a first signal line coupled to the suspended electrode.

6. The apparatus of claim 5, wherein the at least three support members surround the plate member and couple to the plate member at multiple contact points around a perimeter of the plate member.

7. The apparatus of claim 6, wherein the at least three support members comprise four suspended beams each clamped at both ends by the anchors and wherein the plate member comprises a substantially rectangular plate coupled at each of its corners to the four beams.

8. The apparatus of claim 6, wherein the apparatus comprises a micro-electromechanical system ("MEMS") switch, the apparatus further comprising:

a second signal line positioned proximate to the suspended electrode to form a closed circuit with the suspended electrode and the first signal line when the actuation voltage is applied between the actuation electrode and the suspended electrode that causes the suspended electrode to electrostatically collapse towards the actuation electrode; and at least one contact disposed on the suspended electrode and protruding from a surface of the suspended electrode facing the actuation electrode, the contact positioned to make electrical contact with the second signal line when the actuation voltage is applied.

9. The apparatus of claim 8, further comprising:

at least one stopper disposed on the suspended electrode and protruding from the surface of the suspended electrode facing the actuation electrode, the at least one stopper being shorter than the at least one contact; and at least one stopper butt disposed on the substrate and positioned to physically abut the at least one stopper when the actuation voltage is applied, the at least one stopper being electrically insulated from the actuation electrode.

10. The apparatus of claim 8, wherein the second signal line comprises a buried signal trace running under the suspended electrode, the apparatus further comprising:

a dielectric material layer disposed between the actuation electrode and the buried signal trace; and at least one electrical via disposed in the dielectric material layer, the at least one electrical via coupled to the buried signal trace and aligned to make an electrical connection with the at least one contact disposed on the suspended electrode when the actuation voltage is applied.

11. The apparatus of claim 8, wherein the MEMS switch comprises a radio frequency MEMS switch.

12. The apparatus of claim 5, wherein the actuation electrode comprises polysilicon material and the suspended electrode comprises a conductive metal.

13. The apparatus of claim 5, wherein the actuation electrode and the suspended electrode form two substantially parallel plates of a variable capacitor.

14. The apparatus of claim 13, wherein the apparatus comprises a micro-electromechanical system ("MEMS") varactor, the apparatus further comprising:

a second signal line coupled to the actuation electrode.

15. A method of operating a micro-electromechanical system ("MEMS") device, comprising:

applying an actuation voltage between an actuation electrode and a suspended electrode suspended proximate to the actuation electrode, the suspended electrode including at least three support members and a plate member, each of the at least three support members clamped at both ends to a substrate via anchors and the plate member supported by the at least three support members; and electrostatically pulling the suspended electrode towards the actuation electrode; and generating a restoring force by bending the at least three support members of the suspended electrode.

16. The method of claim 15, wherein the MEMS device comprises a MEMS switch, the method further comprising:

close circuiting a contact disposed on the suspended electrode with a first signal line while the actuation voltage is applied;

propagating a signal along a second signal line electrically coupled to the suspended electrode; and propagating the signal from the second signal line through the suspended electrode and the contact, and onto the first signal line.

17. The method of claim 16, further comprising:

disabling the actuation voltage to disable an electrostatic collapsing force generated between the suspended electrode and the actuation electrode;

open circuiting the contact on the suspended electrode from the first signal line; and restoring the suspended electrode to an unactuated position with the resorting force generated by the at least three support members.

18. The method of claim 15, wherein the MEMS device comprises a MEMS varactor, the method further comprising:

increasing a capacitance value of the MEMS varactor by electrostatically pulling the suspended electrode towards the actuation electrode;

propagating an alternating current ("AC") signal along a first signal line coupled to the suspended electrode; and propagating the AC signal from the first signal line through the MEMS varactor to a second signal line coupled to the actuation electrode.

19. The method of claim 18, wherein the actuation voltage is an analog value, the method further comprising:

adjusting the analog value of the actuation voltage up to a pull-in voltage to linearly adjust the capacitance value of the MEMS varactor, wherein the pull-in voltage is a value of the actuation voltage at which point the suspended electrode electrostatically collapses towards the actuation electrode.

20. The method of claim 15, further comprising:

causing thermal expansion of the plate member along a lateral dimension of the plate member due to heating of the MEMS device during operation; and flexing the at least three support members along the lateral dimension in response to the thermal expansion while substantially unaffecting the a vertical orientation of the plate member.

* * * * *